(12) United States Patent
Hoshiai et al.

(10) Patent No.: US 10,698,531 B2
(45) Date of Patent: Jun. 30, 2020

(54) INSPECTION DEVICE AND INSPECTION METHOD

(71) Applicant: Sharp Kabushiki Kaisha, Sakai, Osaka (JP)

(72) Inventors: Noriyuki Hoshiai, Sakai (JP); Shinichi Miyazaki, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/371,367

(22) Filed: Apr. 1, 2019

(65) Prior Publication Data

US 2019/0302958 A1 Oct. 3, 2019

(30) Foreign Application Priority Data

Apr. 3, 2018 (JP) .................. 2018-071589

(51) Int. Cl.
| | |
|---|---|
| *G01R 27/26* | (2006.01) |
| *G06F 3/041* | (2006.01) |
| *G06F 3/044* | (2006.01) |
| *G01R 17/02* | (2006.01) |
| *G01R 17/00* | (2006.01) |

(52) U.S. Cl.
CPC ........... *G06F 3/0416* (2013.01); *G01R 17/00* (2013.01); *G01R 17/02* (2013.01); *G01R 27/26* (2013.01); *G01R 27/2605* (2013.01); *G06F 3/044* (2013.01); *G06F 2203/04106* (2013.01)

(58) Field of Classification Search
CPC .... G01R 27/2605; G01R 27/26; G01R 17/02; G01R 17/00; G01R 31/2856; G06F 3/044; G06F 3/0416; G06F 2203/04106
USPC .......... 324/76.11–76.83, 459, 600, 606, 647, 324/649, 656, 658, 665, 672, 679, 705
See application file for complete search history.

(56) References Cited

U.S. PATENT DOCUMENTS

| | | | | |
|---|---|---|---|---|
| 2010/0013791 | A1* | 1/2010 | Haga | G06F 3/042 345/174 |
| 2013/0285986 | A1* | 10/2013 | Haga | G06F 3/042 345/175 |
| 2014/0028586 | A1* | 1/2014 | Kurashima | G06F 3/0412 345/173 |

FOREIGN PATENT DOCUMENTS

JP  2015-207078 A  11/2015

* cited by examiner

*Primary Examiner* — Raul J Rios Russo
(74) *Attorney, Agent, or Firm* — Keating & Bennett, LLP

(57) ABSTRACT

An embodiment of the present invention makes it possible to carry out stable inspection on performance of a touch panel. An inspection device for inspecting a touch panel on a basis of a resistance value of a transparent film of the touch panel, which includes at least the transparent film, a dielectric member, and a sensor stacked on top of each other, includes: an integrating circuit configured to obtain a background capacitance of the touch panel by applying a first pulsed voltage to the sensor; and a switch configured to connect the transparent film to a ground or to a generator configured to generate a second pulsed voltage which is opposite in phase to the first pulsed voltage.

2 Claims, 2 Drawing Sheets

INSPECTION DEVICE AND INSPECTION METHOD

This Nonprovisional application claims priority under 35 U.S.C. § 119 on Patent Application No. 2018-071589 filed in Japan on Apr. 3, 2018, the entire contents of which are hereby incorporated by reference.

TECHNICAL FIELD

The present invention relates to an inspection device and an inspection method.

BACKGROUND ART

A currently available full-in-cell touch panel has a surface on which a high-resistance transparent film is formed. In this type of panel, in a case where a resistance value of the transparent film becomes smaller than a normal value, a touch signal becomes weaker and consequently, touch sensitivity of the panel deteriorates.

Such deterioration in touch sensitivity of the touch panel can be detected, for example, by checking whether or not a signal value is not smaller than a predetermined value in a case where a testing conductor brought into contact with a panel surface is slid over the panel surface. According to the above method, however, it is likely that the number of inspection steps increases and the testing conductor cannot uniformly come into contact with the panel surface. This disadvantageously leads to unstable inspection and hinders accurate inspection. There is another concern that, for example, the panel surface may be scratched due to contact with the testing conductor.

Note that Patent Literature 1 discloses an inspection device, which is configured to measure an electrostatic capacitance of a touch panel, so as to determine whether the touch panel is good or defective.

CITATION LIST

Patent Literature

[Patent Literature 1]
Japanese Patent Application Publication Tokukai No. 2015-207078 (Publication Date: Nov. 19, 2015)

SUMMARY OF INVENTION

Technical Problem

FIG. 4 illustrates a configuration of a touch panel 1a in accordance with a conventional technique. The touch panel 1a includes a transparent film 11, a color filter (CF) glass 12, a touch panel (TP) sensor 13, a liquid crystal layer 14, and a thin film transistor (TFT) glass 15, which are stacked on top of each other. The transparent film 11 is connected to a ground 7 of an IC 6 via a silver paste 8. In this state, an inspection conductor 9 is brought into contact with the transparent film 11, which serves as a top surface of the touch panel 1a. As a result, deterioration of a touch sensitivity of the touch panel 1a is checked.

The aforementioned problem of unstable inspection on performance of the touch panel occurs because inspection is carried out by a physical method. Conversely, if the inspection on performance is carried out by a non-physical method, the problem of unstable inspection should be avoided.

It is accordingly an object of an embodiment of the present invention to carry out stable inspection on performance of a touch panel.

Solution to Problem

In order to solve the above problem, an inspection device in accordance with an aspect of the present invention is an inspection device for inspecting a touch panel on a basis of a resistance value of a transparent film of the touch panel, the touch panel including at least the transparent film, a dielectric member, and a sensor stacked on top of each other, the inspection device including: a background capacitance obtaining section configured to obtain a background capacitance of the touch panel by applying a first pulsed voltage to the sensor; and a switching section configured to connect the transparent film to a ground or to a generator configured to generate a second pulsed voltage, the second pulsed voltage being opposite in phase to the first pulsed voltage.

In order to solve the above problem, an inspection method in accordance with an aspect of the present invention is an inspection method for inspecting a touch panel on a basis of a resistance value of a transparent film of the touch panel, the touch panel including at least the transparent film, a dielectric member, and a sensor stacked on top of each other, the inspection method including the steps of: obtaining a first background capacitance of the touch panel by applying a first pulsed voltage to the sensor in such a state that the transparent film is connected to a ground; obtaining a second background capacitance of the touch panel by applying the first pulsed voltage to the sensor in such a state that (i) the transparent film is not connected to the ground and (ii) a second pulsed voltage opposite in phase to the first pulsed voltage is applied to the transparent film; and checking the resistance value of the transparent film based on a difference between the first background capacitance and the second background capacitance.

Advantageous Effects of Invention

According to an aspect of the present invention, it is possible to carry out stable inspection on performance of a touch panel.

DESCRIPTION OF EMBODIMENTS

Embodiment 1

The following description will discuss, in detail, Embodiment 1 of the present invention.

Figure 1:
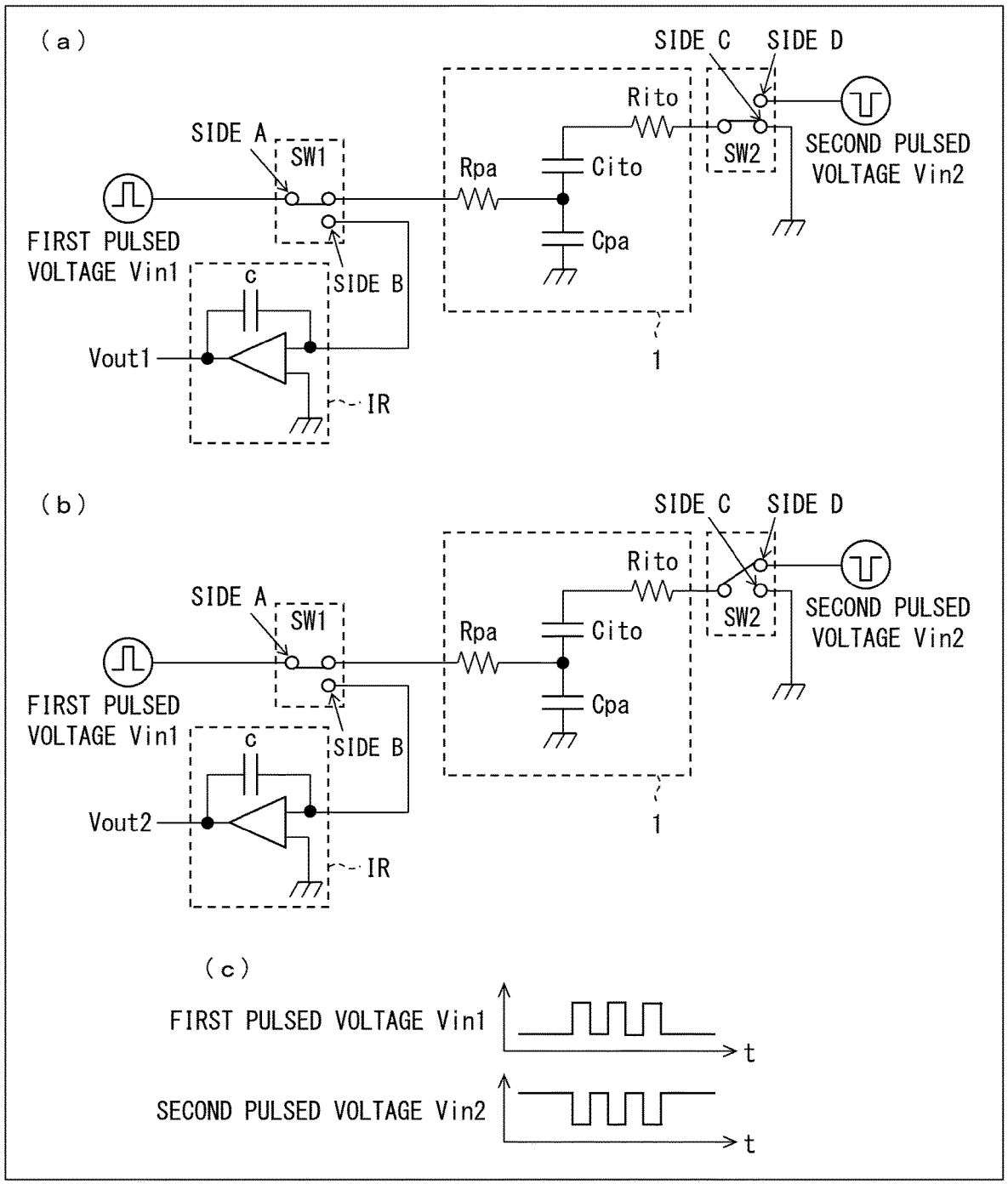
FIG. 1 illustrates a touch panel in accordance with Embodiment 1 of the present invention and a configuration of its peripheral circuit. (a) of FIG. 1 illustrates a circuit configuration employed in a first measurement step. (b) of FIG. 1 illustrates a circuit configuration employed in a second measurement step. (c) of FIG. 1 is a waveform chart illustrating waveforms of a first pulsed voltage and a second pulsed voltage.

FIG. 1 illustrates a touch panel 1 of Embodiment 1 and a configuration of its peripheral circuit. (a) of FIG. 1 illustrates a circuit configuration employed in a first measurement step. (b) of FIG. 1 illustrates a circuit configuration employed in a second measurement step. (c) of FIG. 1 is a waveform chart illustrating waveforms of a first pulsed voltage Vin1 and a second pulsed voltage Vin2.

In an inspection method for inspecting the touch panel 1 on the basis of a resistance value of a transparent film 11 of the touch panel 1, which includes at least the transparent film 11, a CF glass (dielectric member) 12, and a TP sensor (sensor) 13 stacked on top of each other, the inspection method includes the steps of: obtaining a first background capacitance of the touch panel 1 by applying a first pulsed voltage to the TP sensor 13 in such a state that the transparent film 11 is connected to a ground; obtaining a second background capacitance of the touch panel 1 by applying the first pulsed voltage to the TP sensor 13 in such a state that (i) the transparent film 11 is not connected to the ground and (ii) a second pulsed voltage opposite in phase to the first pulsed voltage is applied to the transparent film 11; and checking the resistance value of the transparent film 11 based on a difference between the first background capacitance and the second background capacitance.

The background capacitance of the touch panel 1 herein means the total sum of a capacitance between the transparent film 11 and the TP sensor 13 and a capacitance between the TP sensor 13 and a liquid crystal layer 14.

As illustrated in (a) and (b) of FIG. 1, the touch panel 1 is configured such that a capacitor Cpa, a capacitor Cito, and a resistor Rito are connected in series, and a resistor Rpa is connected between the capacitor Cpa and the capacitor Cito. A capacitance of the capacitor Cpa is a load capacitance of the touch panel 1, that is, a load capacitance of the liquid crystal layer 14 of FIG. 2. A capacitance of the capacitor Cito is a load capacitance between the transparent film 11 and the TP sensor 13 of FIG. 2, that is, a load capacitance of the CF glass 12 of FIG. 2. A resistance of the resistor Rito is a resistance of the transparent film 11 of FIG. 2. A resistance of the resistor Rpa is a resistance across the sensor provided in the touch panel 1, that is, a resistance between a contact pin CP1 and the TP sensor 13 of FIG. 2.

A switch SW1 connects between the resistor Rpa of the touch panel 1 and an integrating circuit IR or a first pulsed voltage Vin1-generating circuit. Switching the switch SW1 to a side A connects between the resistor Rpa of the touch panel 1 and the first pulsed voltage Vin1-generating circuit. On the other hand, switching the switch SW1 to a side B connects between the resistor Rpa of the touch panel 1 and the integrating circuit IR.

The integrating circuit IR is provided with a capacitor c, and configured to output a voltage corresponding to an amount of electric charges accumulated in the touch panel 1.

A switch SW2 connects between the resistor Rito of the touch panel 1 and a ground or a second pulsed voltage Vin2-generating circuit. Switching the switch SW2 to a side C connects between the resistor Rito of the touch panel 1 and the ground. On the other hand, switching the switch SW2 to a side D connects between the resistor Rito of the touch panel 1 and the second pulsed voltage Vin2-generating circuit.

As illustrated in (c) of FIG. 1, a waveform of the first pulsed voltage Vin1 is opposite to that of the second pulsed voltage Vin2.

(Procedure of Each Step)

A process of inspection on performance of the touch panel 1 includes: a first measurement step (the step of obtaining a first background capacitance) (Steps S1 and S2); a second measurement step (the step of obtaining a second background capacitance) (Steps S3 and S4); and a checking step (the step of checking the resistance value) (Step S5).

The first measurement step is performed in accordance with the following procedure.

(Step S1)

As illustrated in (a) of FIG. 1, the inspection device switches the switch SW1 to the side A and also switches the switch SW2 to the side C. Specifically, the resistor Rpa of the touch panel 1 is connected to the first pulsed voltage Vin1-generating circuit, and the resistor Rito of the touch panel 1 is connected to the ground.

The above switching causes the first pulsed voltage Vin1 to be applied to the touch panel 1, so that the capacitor Cpa and the capacitor Cito are charged.

(Step S2)

After the completion of charging of the capacitor Cpa and the capacitor Cito, the inspection device switches the switch SW1 to the side B. Specifically, the resistor Rpa of the touch panel 1 is connected to the integrating circuit IR.

The above switching causes the capacitor Cpa and the capacitor Cito to discharge electric charges, so that the integrating circuit IR outputs a voltage Vout1 corresponding to the capacitances of the capacitor Cpa, the capacitor Cito, and the capacitor C.

The second measurement step is performed in accordance with the following procedure.

(Step S3)

As illustrated in (b) of FIG. 1, the inspection device switches the switch SW1 to the side A and switches the switch SW2 to the side D. Specifically, the resistor Rpa of the touch panel 1 is connected to the first pulsed voltage Vin1-generating circuit, and the resistor Rito of the touch panel 1 is connected to the second pulsed voltage Vin2-generating circuit.

The above switching causes the first pulsed voltage Vin1 and the second pulsed voltage Vin2 to be applied to the touch panel 1, so that the capacitor Cpa and the capacitor Cito are charged.

(Step S4)

After the completion of charging of the capacitor Cpa and the capacitor Cito, the inspection device switches the switch SW1 to the side B. Specifically, the resistor Rpa of the touch panel 1 is connected to the integrating circuit IR.

The above switching causes the capacitor Cpa and the capacitor Cito to discharge electric charges, so that the integrating circuit IR outputs the voltage Vout2 corresponding to the capacitances of the capacitor Cpa, the capacitor Cito, and the capacitor C.

The inspection step is performed in accordance with the following procedure.

(Step S5)

In a case where a difference between the output voltage Vout1 and the output voltage Vout2 is not smaller than a predetermined value, it is determined that the resistance value of the transparent film 11 is small.

In a case where the resistance value of the transparent film 11 (corresponding to the value of the resistance of the resistor Rito) is not smaller than the predetermined value, the difference between the output voltage Vout1 and the output voltage Vout2 is as follows.

$$Vout1 = V \times Cpa/C$$

$$Vout2 = V \times Cpa/C$$

Then, the difference is expressed as follows:

$$Vout2 - Vout1 = 0.$$

More specifically, since the resistor Rito has a large resistance, the capacitor Cito is not charged even when the second pulsed voltage Vin2 is applied to the touch panel 1. As a result, the output voltage Vout1 and the output voltage Vout2 become equal to each other.

On the other hand, in a case where the resistance value of the transparent film 11 (corresponding to the value of the resistance of the resistor Rito) is smaller than the predetermined value, the difference between the output voltage Vout1 and the output voltage Vout2 is as below.

$$Vout1 = V \times (Cpa + Cito)/C$$

$$Vout2 = V \times (Cpa + 2 \times Cito)/C$$

Then, the difference is expressed as follows:

$$Vout2 - Vout1 = V \times Cito/C$$

More specifically, since the resistor Rito has a small resistance, the capacitor Cito is charged when the second pulsed voltage Vin2 is applied to the touch panel 1. As a result, the output voltage Vout2 becomes higher than the output voltage Vout1 by an amount of charge accumulated in the capacitor Cito by application of the voltage Vin2.

Embodiment 1 allows detecting a case in which the resistance value of the transparent film 11 (corresponding to the value of the resistance of the resistor Rito) is small, that is, a deterioration in performance of the touch panel. By employing an electrical inspection method instead of a physical inspection method, Embodiment 1 also allows achieving higher reproducibility of inspection results while preventing damage (e.g., scratch) to the panel surface. Therefore, Embodiment 1 allows for stable inspection on performance of the touch panel 1.

Embodiment 2

The following description will discuss Embodiment 2 of the present invention. For convenience, the same reference signs will be given to members having the same functions as those of Embodiment 1, and their descriptions will be omitted.

Note that it is preferred to carry out inspection on performance of a touch panel 1 in a state prior to mounting the touch panel 1 to a module. This is because, in a case where inspection on performance of the touch panel is carried out by using a product (module) including the touch panel and then a resistance value of the transparent film 11 is found to be small, members mounted on the module may be useless.

Figure 2:
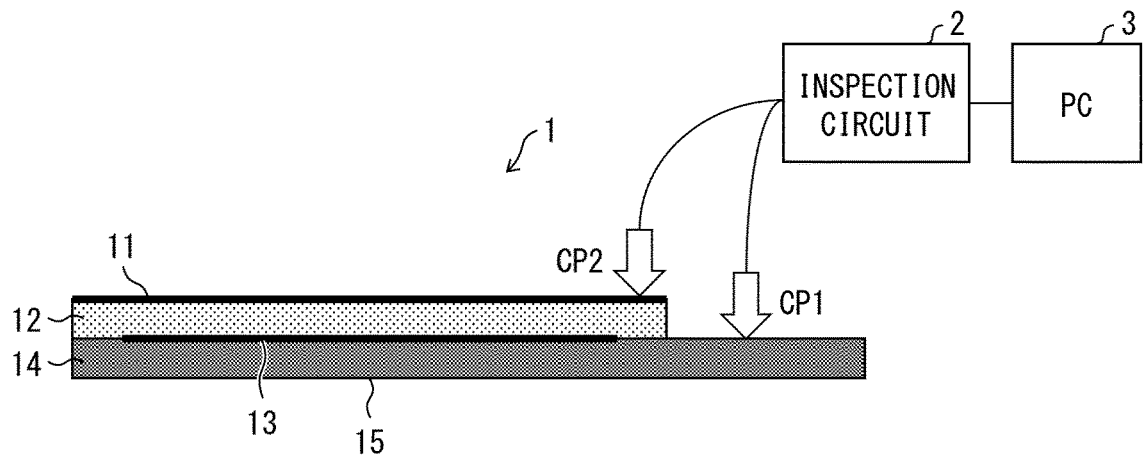
FIG. 2 illustrates a touch panel and an inspection device in accordance with Embodiment 2 of the present invention.

FIG. 2 illustrates a touch panel 1 and an inspection device in accordance with Embodiment 2. The touch panel 1 includes a transparent film 11, a CF glass 12, a TP sensor 13, a liquid crystal layer 14, and a TFT glass 15, which are stacked on top of each other.

The touch panel 1 has a terminal provided on the surface of the transparent film 11, and another terminal provided on the surface of a right end portion of the liquid crystal layer 14 (not illustrated in FIG. 2). An inspection circuit 2 is connected to the terminal on the liquid crystal layer 14 of the touch panel 1 via a contact pin CP1, and also connected to the terminal on the transparent film 11 of the touch panel 1 via a contact pin CP2 (see FIG. 2). The inspection circuit 2 is also connected to a personal computer (PC) 3 and controlled by a program that runs on the PC 3, so that a process of inspection on performance of the touch panel 1 is carried out.

The inspection circuit 2 separately carries out a process of inspecting the TP sensor 13 itself before inspection on performance of the touch panel 1, so as to confirm that the TP sensor 13 normally operates. After this confirmation, the inspection circuit 2 carries out the process of inspection on performance of the touch panel 1.

Note that the inspection circuit 2 includes switches SW1 and SW2, an integrating circuit IR, a first pulsed voltage Vin1-generating circuit, and a second pulsed voltage Vin2-generating circuit, which are illustrated in FIG. 1. Further, the terminal on the liquid crystal layer 14 corresponds to a left terminal of a resistor Rpa of FIG. 1. Meanwhile, the terminal on the transparent film 11 corresponds to a right terminal of a resistor Rito of FIG. 1.

Embodiment 3

The following description will discuss Embodiment 3 of the present invention. For convenience, the same reference signs will be given to members having the same functions as those of Embodiments 1 and 2, and their descriptions will be omitted.

Whereas Embodiment 2 describes an example case employing a PC 3 dedicated to inspection, Embodiment 3 describes an example case where a PC is not employed.

In an inspection device 4 for inspecting a touch panel 1 on the basis of a resistance value of a transparent film 11 of the touch panel 1, which includes at least the transparent film 11, a CF glass 12, and a TP sensor 13 stacked on top of each other, the inspection device 4 includes: a background capacitance obtaining section configured to obtain a background capacitance of the touch panel 1 by applying a first pulsed voltage Vin1 to the TP sensor 13; and a switch (switching section) SW2 configured to connect the transparent film 11 to a ground or to a generator circuit (generator) configured to generate a second pulsed voltage Vin2, the second pulsed voltage Vin2 being opposite in phase to the first pulsed voltage Vin1. Note that the background capacitance obtaining section includes a switch SW1, a generating circuit configured to generate the first pulsed voltage Vin1, and an integrating circuit IR.

Figure 3:
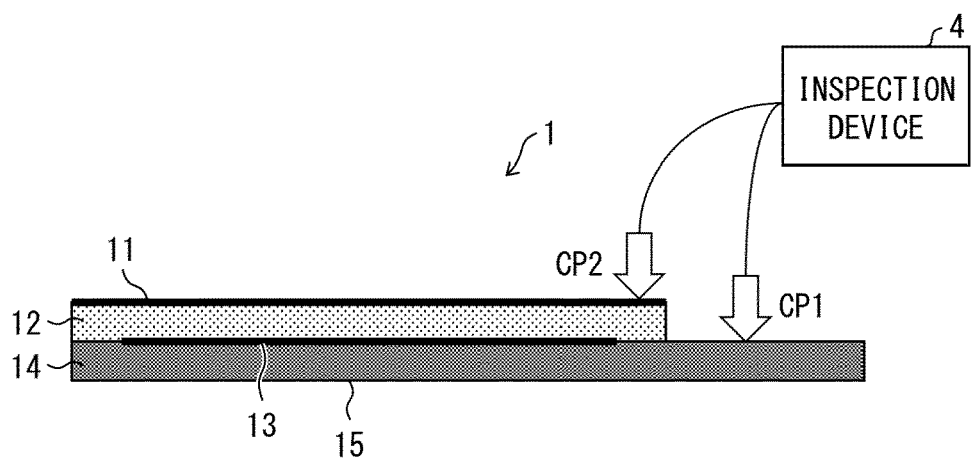
FIG. 3 illustrates a touch panel and an inspection device in accordance with Embodiment 3 of the present invention.
Figure 4:
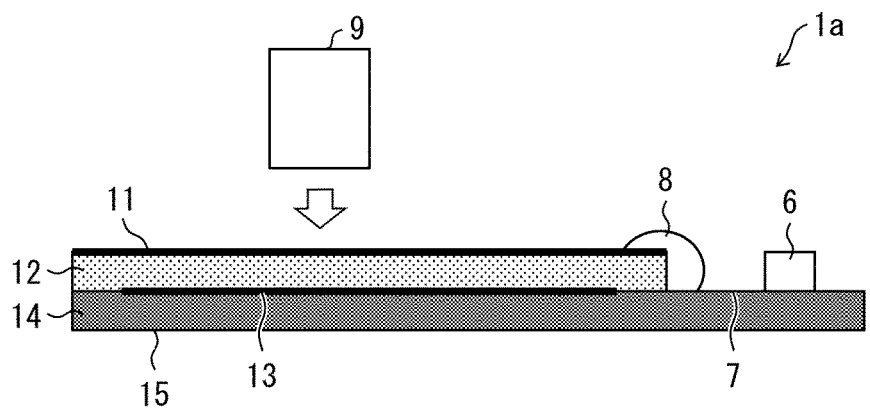
FIG. 4 illustrates a configuration of a touch panel in accordance with a conventional technique.

FIG. 3 illustrates the touch panel 1 and the inspection device in accordance with Embodiment 3. As illustrated in FIG. 3, the inspection device 4 is connected to a terminal on a liquid crystal layer 14 of the touch panel 1 via a contact pin CP1 and also connected to another terminal on the transparent film 11 of the touch panel 1 via a contact pin CP2.

The inspection device 4 includes an inspection circuit, a microcomputer, and a simple display device (not illustrated).

With this configuration which requires no PC, it is possible to provide, at a low cost, a suitable environment for inspection on performance of the touch panel 1.

The present invention is not limited to the foregoing embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

[Recap]

[First Aspect]

An inspection device in accordance with a first aspect of the present invention is an inspection device for inspecting a touch panel on a basis of a resistance value of a transparent film of the touch panel, the touch panel including at least the transparent film, a dielectric member, and a sensor stacked on top of each other, the inspection device including: a background capacitance obtaining section configured to obtain a background capacitance of the touch panel by applying a first pulsed voltage to the sensor; and a switching section configured to connect the transparent film to a ground or to a generator configured to generate a second pulsed voltage, the second pulsed voltage being opposite in phase to the first pulsed voltage.

[Second Aspect]

An inspection method in accordance with a second aspect of the present invention is an inspection method for inspecting a touch panel on a basis of a resistance value of a transparent film of the touch panel, the touch panel including at least the transparent film, a dielectric member, and a sensor stacked on top of each other, the inspection method including the steps of: obtaining a first background capacitance of the touch panel by applying a first pulsed voltage to the sensor in such a state that the transparent film is connected to a ground; obtaining a second background capacitance of the touch panel by applying the first pulsed voltage to the sensor in such a state that (i) the transparent film is not connected to the ground and (ii) a second pulsed voltage opposite in phase to the first pulsed voltage is applied to the transparent film; and checking the resistance value of the transparent film based on a difference between the first background capacitance and the second background capacitance.

REFERENCE SIGNS LIST

1 Touch panel
4 Inspection device
11 Transparent film
12 CF glass (dielectric member)
13 TP sensor (sensor)
IR Integrating circuit (background capacitance obtaining section)
SW1 Switch (background capacitance obtaining section)
SW2 Switch (switching section)

The invention claimed is:

1. An inspection device for inspecting a touch panel on a basis of a resistance value of a transparent film of the touch panel, the touch panel including at least the transparent film, a dielectric member, and a sensor stacked on top of each other, said inspection device comprising:

a background capacitance obtaining section configured to obtain a background capacitance of the touch panel by applying a first pulsed voltage to the sensor; and a switching section configured to connect the transparent film to a ground or to a generator configured to generate a second pulsed voltage, the second pulsed voltage being opposite in phase to the first pulsed voltage.

2. An inspection method for inspecting a touch panel on a basis of a resistance value of a transparent film of the touch panel, the touch panel including at least the transparent film, a dielectric member, and a sensor stacked on top of each other, said inspection method comprising the steps of:

obtaining a first background capacitance of the touch panel by applying a first pulsed voltage to the sensor in such a state that the transparent film is connected to a ground;

obtaining a second background capacitance of the touch panel by applying the first pulsed voltage to the sensor in such a state that (i) the transparent film is not connected to the ground and (ii) a second pulsed voltage opposite in phase to the first pulsed voltage is applied to the transparent film; and checking the resistance value of the transparent film based on a difference between the first background capacitance and the second background capacitance.

\* \* \* \* \*